United States Patent
Suzuki et al.

(10) Patent No.: US 6,870,096 B2
(45) Date of Patent: Mar. 22, 2005

(54) ELECTRICAL JUNCTION BOX AND METHOD OF MANUFACTURING THE SAME

(75) Inventors: Katsuya Suzuki, Susono (JP); Hiroaki Sakata, Susono (JP); Yuichi Ishida, Ogasa-gun (JP); Kazuhiro Shimizu, Ogasa-gun (JP); Tatsuya Inaba, Ogasa-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/447,287

(22) Filed: May 29, 2003

(65) Prior Publication Data

US 2004/0007379 A1 Jan. 15, 2004

(30) Foreign Application Priority Data

May 29, 2002 (JP) ...................................... P2002-155802
Jul. 8, 2002 (JP) ...................................... P2002-198778

(51) Int. Cl.[7] ................................................. H02G 3/08
(52) U.S. Cl. ........................ 174/50; 174/59; 439/76.2; 220/3.2
(58) Field of Search ................................ 174/50, 17 R, 174/58, 59, 50.52, 60, 52.1; 439/76.1, 76.2, 949, 688, 34, 620, 724, 65, 66, 69; 361/600, 601, 611, 624, 637, 648, 641; 220/3.2, 3.3, 3.8, 4.02

(56) References Cited

U.S. PATENT DOCUMENTS

| | | | | | |
|---|---|---|---|---|---|
| 5,501,605 A | * | 3/1996 | Ozaki et al. | ................ | 439/76.2 |
| 6,315,578 B1 | * | 11/2001 | Kasai et al. | ................ | 439/76.2 |
| 6,430,054 B1 | * | 8/2002 | Iwata | ........................ | 174/52.1 |
| 6,494,722 B1 | * | 12/2002 | Sakamoto et al. | ......... | 439/76.2 |
| 6,514,091 B2 | * | 2/2003 | Saito et al. | ................ | 439/76.2 |
| 6,583,353 B2 | * | 6/2003 | Murakoshi et al. | ........... | 174/50 |
| 6,599,135 B2 | * | 7/2003 | Yamane | ..................... | 439/76.2 |

FOREIGN PATENT DOCUMENTS

| | | | | | |
|---|---|---|---|---|---|
| JP | 2000-139016 | * | 5/2000 | ................ | 439/76.2 |
| JP | 2000-201417 | | 7/2000 | | |

* cited by examiner

Primary Examiner—Dean A. Reichard
Assistant Examiner—Angel R. Estrada
(74) Attorney, Agent, or Firm—Sughrue Mion, PLLC

(57) ABSTRACT

In an electrical junction box, a first board part and a second board part are arranged substantially in parallel while opposing to each other. An electric wire extends along both of the first board part and the second board part, and has a bent portion extending across a gap defined between the first board part and the second board part. An electronic unit is disposed in the gap.

10 Claims, 11 Drawing Sheets

Fig. 11C
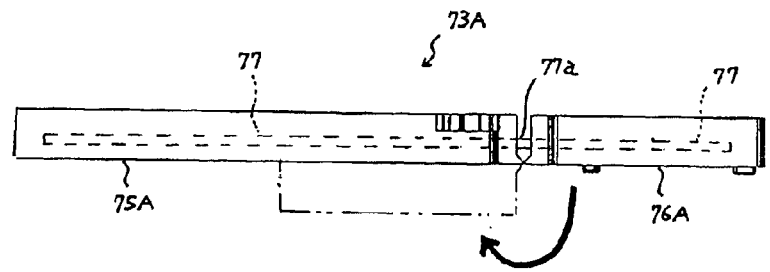
Fig. 11A
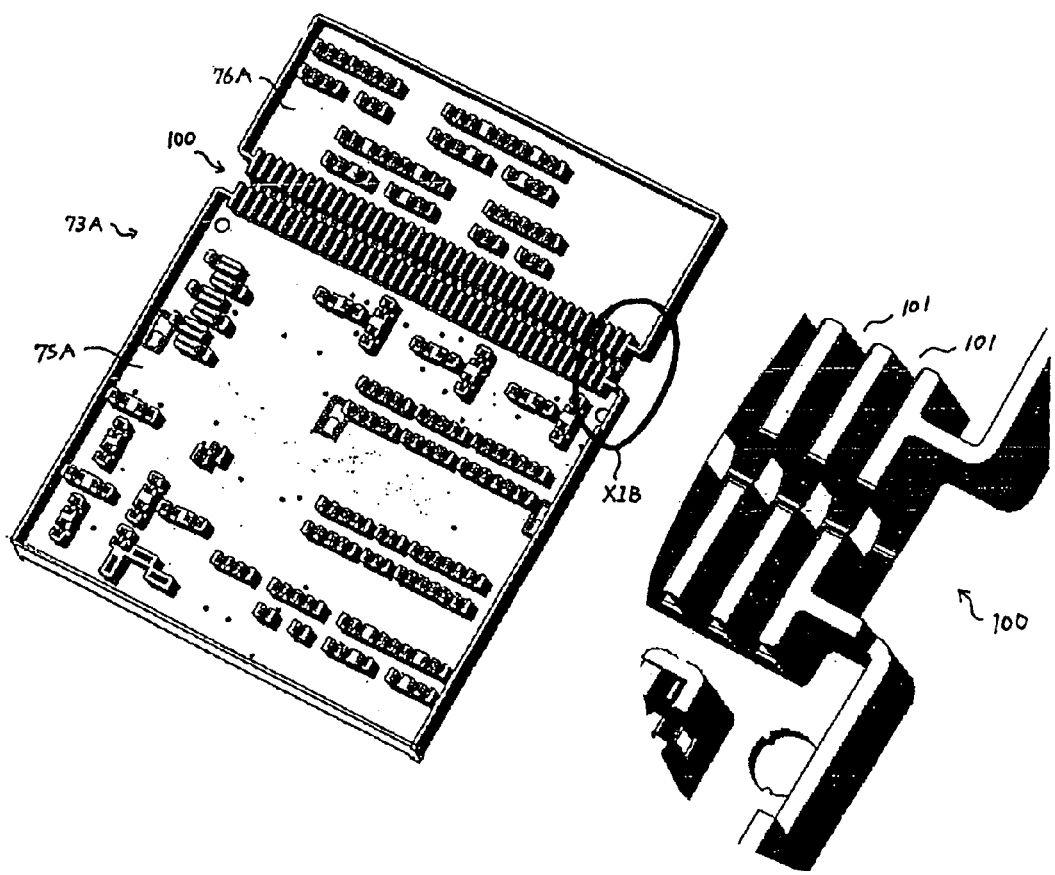
Fig. 11B

ELECTRICAL JUNCTION BOX AND METHOD OF MANUFACTURING THE SAME

BACKGROUND OF THE INVENTION

The present invention relates to an electrical junction box of a type that an electronic unit is contained therein, and also relates to a method of manufacturing such an electrical junction box.

In recent years, use of the electrical junction box has become diversified, and there are some electrical junction boxes which are provided with controlling function in addition to simple power distributing function. FIG. 10 shows an example of such an electrical junction box.

This electrical junction box 61 includes: a plurality of wiring boards 64 on which a number of electric wires 62 are arranged; terminals 63 for connectors to be electrically connected at appropriate positions of the arranged electric wires 62 are provided uprightly; an electronic unit 66 which is an electronic board carrying thereon electronic components 65; an upper casing 67 and a lower casing 68 which are made of electrically insulating material and adapted to contain these members.

On an outer face of the upper casing 67, there are formed connector housings (hood members) 69*a,* and the terminals on the wiring boards 64 are projected into the connector housings 69*a,* thereby to constitute connectors 69.

In this electrical junction box 61, a desired pattern of diverged circuits can be formed by the electric wires 62 on the wiring boards 64, and at the same time, wiring works inside the upper and lower casings 67, 68 can be mitigated by utilizing the terminals 63 which are directly provided uprightly on the wiring boards 64.

However, in this electrical junction box 61, since the terminals 63 of the connectors 69 are directly provided on the wiring boards 64, the connectors 69 are unable to be mounted on an area in which the wiring board 64 is not provided (an area in which the electronic unit 66 is provided). Thus, the connectors 69 are unable to be provided in a space S of the upper casing 67 which corresponds to an upper face of the electronic unit 66. Since the positions of the connectors 69 are thus restricted, the electrical junction box 61 has become inevitably large-sized, because provision of the connectors 69 must be ensured at other positions.

In this connection, there is such an idea that a through hole may be formed in an insulating board of the electronic unit 66, and the terminals 63 are passed through this through hole to install the connectors 69 in a space on the upper face of the electronic unit 66. However, this idea is not practical, because there are such inconveniences that formation of the through hole may lead to a rise of cost, and mounting positions of the electronic components 65 may be limited.

Besides the above described electrical junction box, there is another type of related-art electric junction box (not shown) to be mounted on an automobile or the like, which comprises: an upper casing and a lower casing made of synthetic resin; a plurality of bus-bar wiring boards arranged inside the lower casing; a plurality of housings which are integrally provided on the upper casing; terminals continued to the bus-bars made of electrically conductive metal and positioned inside the housings; and an electronic unit which is additionally provided, for example, on an outer face of the lower casing.

Electrical components such as connectors of exterior wire harnesses, relays, fuses and so on are connected to the housings, and electrical currents which have been inputted via the connectors from, for example, a power line of a vehicle are outputted from other connectors via the fuses and relays to loads such as external electrical equipments and auxiliaries. At the same time, signal currents are inputted into the electronic unit to control the auxiliaries such as an engine, an automatic transmission, etc.

In this electrical junction box, because the electronic unit has to be joined to the casing (a junction box body), the structure may become bulky and assembling performance may be bad. Further, because the electronic unit is arranged on the outer face of the lower casing, connections between the connectors and the fuses can be conducted only on the upper casing. Therefore, very few connections can only be conducted, and an increase of the electrical equipments and auxiliaries in the vehicle cannot be coped with.

SUMMARY OF THE INVENTION

It is therefore an object of the invention to provide an electrical junction box in which degree of freedom in an lay-out of the connectors can be enhanced in spite of provision of an electronic unit, connections between circuits of various types can be coped with, and further, which can be made compact (small-sized) in structure, and can be easily assembled. It is also an object of the invention to provide a method of manufacturing such an electrical junction box.

In order to achieve the above objects, according to the invention, there is provided an electrical junction box, comprising:

a first board part and a second board part, arranged substantially in parallel while opposing to each other;

an electric wire, extending along both of the first board part and the second board part, and having a bent portion extending across a gap defined between the first board part and the second board part; and an electronic unit, disposed in the gap.

In such a configuration, the places for positioning the connectors will not be limited by the existence of the electronic unit, and a layout of the connectors can be more freely designed.

Preferably, the first board part and the second board part are integrated by a flexible part along which the bent portion of the electric wire is arranged. In such a configuration, the board portions can be easily handled.

Preferably, the electronic unit is electrically connected an fixed to at least one of the first board part and the second board part.

In such a configuration, at the same time when the electronic unit is set with respect to the board portions, connection between them can be easily established. Moreover, a backlash of the electronic unit can be prevented, and the electronic unit can be held substantially at a center of the electrical junction box in a stabilized state.

For example, by electrically connecting the electronic unit to one of the board portions in a state where the two board portions are extended to lie in a plane, and fixing them by a screw or the like. After then, by opposing the two board portions, the electronic unit can be easily connected and secured in the electrical junction box.

Preferably, the electrical junction box further comprises a spacer disposed at least one of between the first board portion and the second board portion, between the electronic unit and the first board portion, and between the electronic unit and the second board portion.

In such a configuration, the board portions will be prevented by the spacers from contacting or pressing electronic components on the electronic unit. Moreover, a distance between the board portions, and distances between the board portions and, for example, a board of the electronic unit can be accurately regulated. Accordingly, positions of the terminals on the board portions, positions of the terminals and connectors of the electronic unit can be accurately regulated, and connecting accuracy with respect to mating terminals will be enhanced.

Preferably, the electrical junction box further comprises: a terminal, disposed on each outer face of the first board part and the second board part so as to electrically connect to the electric wire; and a housing, containing the terminal therein.

In such a configuration, since the electronic unit is disposed between the two board portions, while connectors of wire harnesses and electrical components such as fuses, relays are connected to the terminals disposed outside of the two board portions, the exterior connectors and various electrical components can be connected by way of the electrical junction boxes while the electronic unit is contained therein. It will be possible to cope with diversified connections and to make the electrical junction box compact.

In this case, the terminals are contained in the housings to constitute the connectors and electrical component mounting parts, namely, a fuse mounting part and a relay mounting part. The connectors are engaged and connected with the connectors of the exterior wire harnesses, while the fuse mounting part is connected with fuses, and the relay mounting part is connected with relays respectively.

Here, it is preferable that the electronic unit comprises a connector terminal which is directed parallel with an extending direction of the first board part and the second board part.

In such a configuration, since the connectors are distributed at various positions of the case in this manner, an increased number of the circuits can be connected, and the electrical junction box itself can be made compact, provided that the number of the circuits to be connected is the same.

It is also preferable that the electrical junction box further comprises a positioning member which determines a position of the housing with respect to associated one of the first board portion and the second board portion.

In such a configuration, the housings can be accurately positioned on the board portions, so that positions between press-fitting portions of the terminals in the housings with respect to the electric wires can be accurately regulated. It is also possible to provisionally fix the connectors to the board portions.

It is also preferable that the electrical junction box further comprises a casing, which contains therein at least the first board portion, the second board portion, the electronic unit and the electric wire.

In such a configuration, the electronic unit can be protected by both the board portions and the casing from water drops, dust and so on in the exterior.

Here, it is further preferable that: the casing is formed with a hole through which the housing is protruded outward; and the housing is formed with a flange portion which is pressed by the outer face of each of the first board portion and the second board portion, so that the flange portion is abutted against an inner face of the casing at an edge portion of the hole.

In such a configuration, by passing the housings through the holes of the casing, positioning and assembling of the housing can be easily performed. Moreover, the flange portions of the housings are clamped and held between the casing and the board portions, and securing of the housings can be easily performed. Locking member or the like for the housings are not required. Further, because the housings are formed as separate members from the casing and the board portions, molds for resin molding of the housings, the board portions and the case can be simplified in shape.

Alternatively, it is preferable that the housing is integrally formed with either the casing or at least one of the first board portion and the second board portion.

In such a configuration, in case where the housings and the board portions are integrally formed, it will be unnecessary to position the housings with respect to the board portions, and assembling performance will be enhanced. At the same time, the press-fitting positions between the terminals and the electric wires will become more accurate. On the other hand, in case where the housings are integrally formed with the casing, it will be unnecessary to fix the housings, and the assembling performance will be enhanced.

According to the invention, there is also provided a method of manufacturing an electrical junction box, comprising steps of:

providing a first table having a first setting face and a second table having a second setting face, which are movable between a first position in which the first setting face and the second setting face are open, and a second position in which the first setting face and the second setting face are opposed to each other;

disposing a first board portion on the first setting face situated in the first position;

disposing a second board portion on the second setting face situated in the first position;

disposing an electric wire so as to extend along both of the first board portion and the second board portion;

disposing an electronic unit so as to face either the first board portion or the second board portion; and moving the first table and the second table to the second position, so that the electronic unit is disposed between a gap defined between the first board portion and the second board portion opposing to each other, and a bent portion is formed on the electric wire so as to extend across the gap.

Preferably, the first table and the second table is interconnected by a hinge member so as to movable between the first position and the second position by a pivotal action of the hinge member.

In such a configuration, opening and closing operations of the tables will be made easy and accurate, and assembling workability and productivity of the electrical junction box will be improved.

Preferably, the manufacturing method further comprises a step of disposing a casing adapted to contain therein at least the first board portion, a part of the electric wire on the first setting face situated in the first position, before the step of disposing the first board portion on the first setting face.

In such a configuration, the productivity of the electrical junction box will be enhanced.

BRIEF DESCRIPTION OF THE DRAWINGS

The above objects and advantages of the present invention will become more apparent by describing in detail preferred exemplary embodiments thereof with reference to the accompanying drawings, wherein:

FIG. 11A is a perspective view showing a modified example of the electrical junction box of FIG. 1; FIG. 11B is an enlarged view of the circle XIB in FIG. 11A; and FIG. 11C is a side view of the electrical junction box of FIG. 11A.

DETAILED DESCRIPTION OF THE PREFERRED EMBODIMENTS

Figure 1:
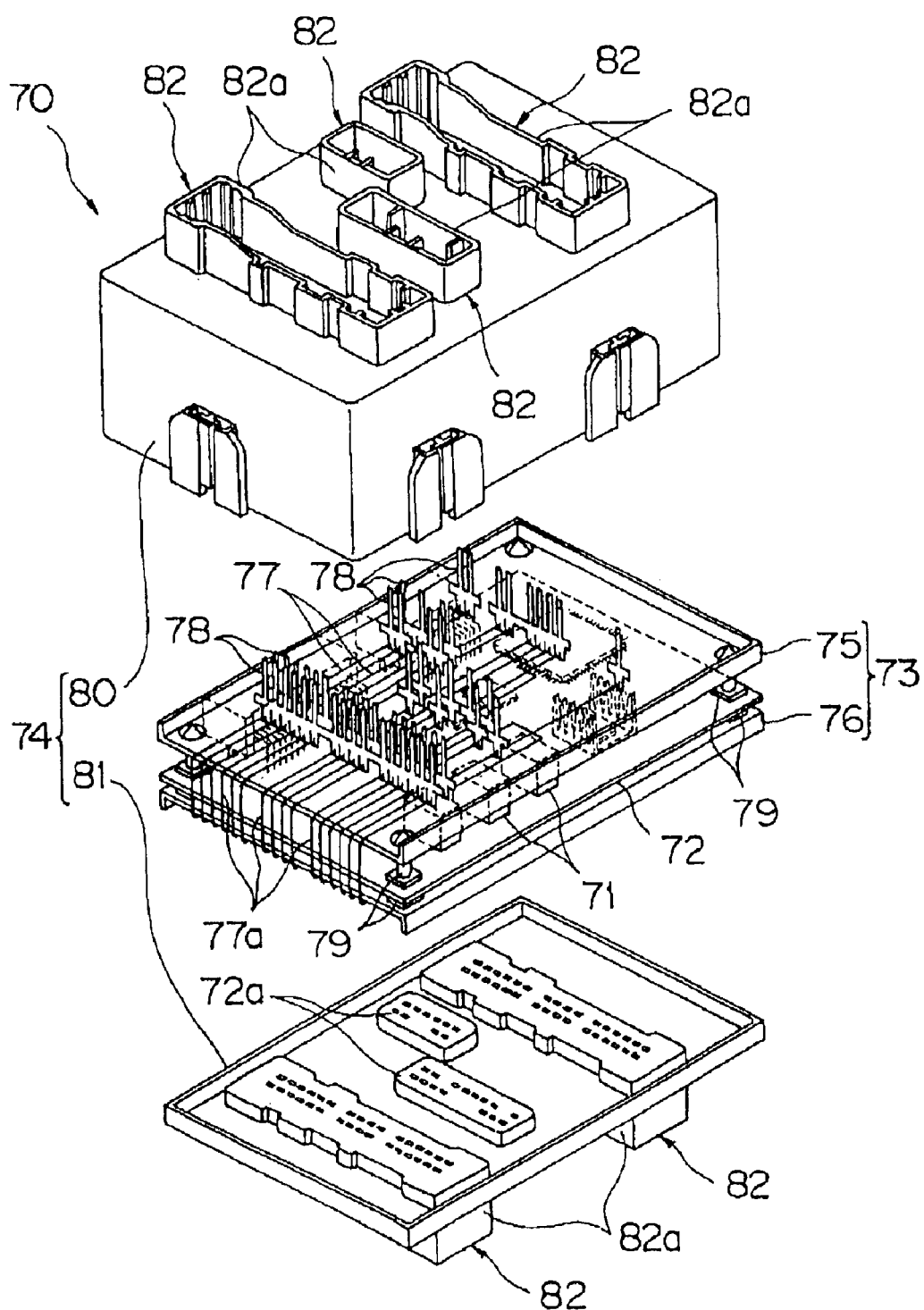
FIG. 1 is an exploded perspective view showing an electrical junction box according to a first embodiment of the invention.
Figure 2:
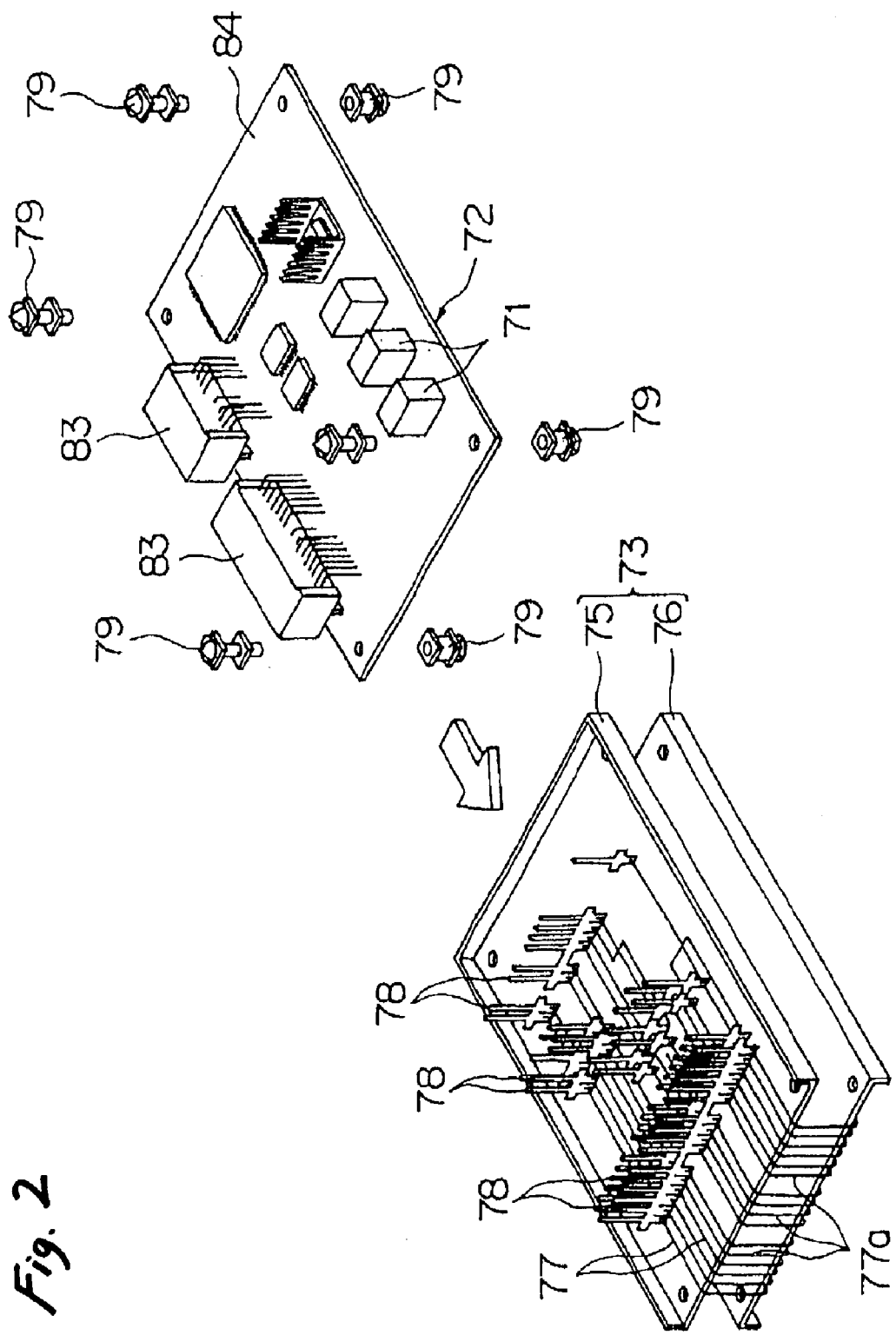
FIG. 2 is an exploded perspective view showing an assembly of wiring boards and an electronic unit in the electrical junction box.

FIGS. 1 and 2 show an electrical junction box according to a fist embodiment of the invention.

As shown in FIG. 1, an electrical junction box 70 comprises: an electronic unit (electronic board) 72 having electronic components 71 and connectors 83 (see FIG. 2) mounted on an insulating board 84; a wiring board unit 73 disposed above and below the electronic unit 72; and a junction box body 74 which contains these members 72, 73.

As shown in FIG. 2, the wiring board unit 73 includes a first wiring board 75 and a second wiring board 76 which are separated from each other. On each one face of the wiring boards 75, 76, a number of sheathed electric wires 77 are arranged, and there are uprightly provided terminals 78 for connectors which are electrically connected at appropriate positions of the electric wires 77 by press-fitting. The wiring boards 75, 76, a plurality of the electric wires 77, the terminals 78, and spacers (support posts) 79 constitute a wiring board assembly.

The wiring board unit 73 is configured by bending at predetermined positions 77a of the electric wires 77 which are arranged across both the wiring boards 75, 76, so that the first wiring boards 75 and the second wiring board 76 are arranged in parallel and the electronic unit 72 can be located therebetween. The connectors 83 on the electronic unit 72 are positioned between the two wiring boards 75, 76 and directed to one side of the casing 80 not so as to face the wiring boards 75, 76.

The spacers 79 are interposed respectively between the first wiring board 75 and the insulating board of the electronic unit 72, and between the second wiring board 76 and the insulating board of the electronic unit 72. The wiring boards 75, 76 and the electronic unit 72 are arranged in a stacked manner while keeping a predetermined distance from one another by these spacers 79. One end of the spacer 79 is formed in a conical shape to be abutted and fitted with positioning holes in the wiring boards 75, 76, and the other end of the spacer 79 is formed with a flange to be abutted against the insulating board of the electronic unit 72.

As shown in FIG. 1, the junction box body 74 is composed of an upper casing (an upper cover) 80 made of synthetic resin, and a lower casing (a lower cover) 81 made of synthetic resin which is adapted to be joined to a lower end face of the upper casing 80. Each of these casings 80, 81 is integrally provided with housings (hood members) 82a of the connectors 82. The terminals 78 for the connectors of the wiring board unit 73 which are contained in the junction box body 74 are projected into the housings 82a respectively, thereby to constitute the connectors 82.

According to the above configuration, since the first wiring board 75 and the second wiring board 76 can be respectively arranged above and below the electronic unit 72, the connectors 82 can be disposed at predetermined positions of the junction box body 74 which are opposed to the wiring boards 75, 76. For this reason, positioning of the connectors 82 will not be restricted by the electronic unit 72. As shown in FIG. 1, the connectors 82 are respectively provided in a state distributed at appropriate positions of the upper and the loser casings 80, 81. In this manner, degree of freedom in the layout of the connectors 82 will be enhanced, and the electrical junction box 70 can be made compact as a whole. In addition, because the connectors 83 of the electronic unit 72 are provided in a direction different from the other connectors 82, a space inside the electrical junction box 70 can be effectively utilized, as the connectors 82, 83 are distributed.

Furthermore, since the wiring board unit 73 is configured by bending the predetermined positions 77a of the electric wires 77 which are arranged across the individual wiring boards 75, 76, the opposing structure of the wiring board unit 73 can be easily formed (manufactured). Since the electric wires 77 are formed of copper wires which can be plastically deformed in an ordinary state, the opposing structure can be easily obtained taking advantage of property of the copper wire.

A sheet of elongated wiring board having flexibility may be adopted in place of the two wiring boards 75, 76, and to fold this single wiring board substantially at a middle in a longitudinal direction thereby to constitute two sheets of wiring board parts which are opposed to each other in parallel or substantially in parallel. Also a wiring board having two rigid parts and a flexible part (an area to be folded) arranged therebetween may be adopted. More specifically, as shown in FIG. 11A, two wiring board parts 75A, 76A may be connected by a flexible hinge portion 100 to constitute a sheet of elongated wiring board 73A. As shown in FIG. 11B, the hinge portion 100 is formed with a plurality of grooves 101 adapted to respectively receive the bent portions 77a of the electric wires 77. As indicated by an arrow in FIG. 11C. the elongated wiring board 73A is folded such that the two wiring board parts 75A, 75B are opposed to each other.

Moreover, because the spacers 79 are interposed respectively between the first wiring board 75 and the insulating board 84 of the electronic unit 72, and between the second wiring board 76 and the insulating board 84 of the electronic unit 72, the wiring board unit 73 will not come in contact with nor press the electronic components 71 of the electronic unit 72.

The wiring board unit 73 may be configured by bending the electric wires twice or more such that at least three wiring boards are opposed with each other. Each of a plurality of electronic units may be inserted between a pair of opposing wiring boards.

Figure 3:
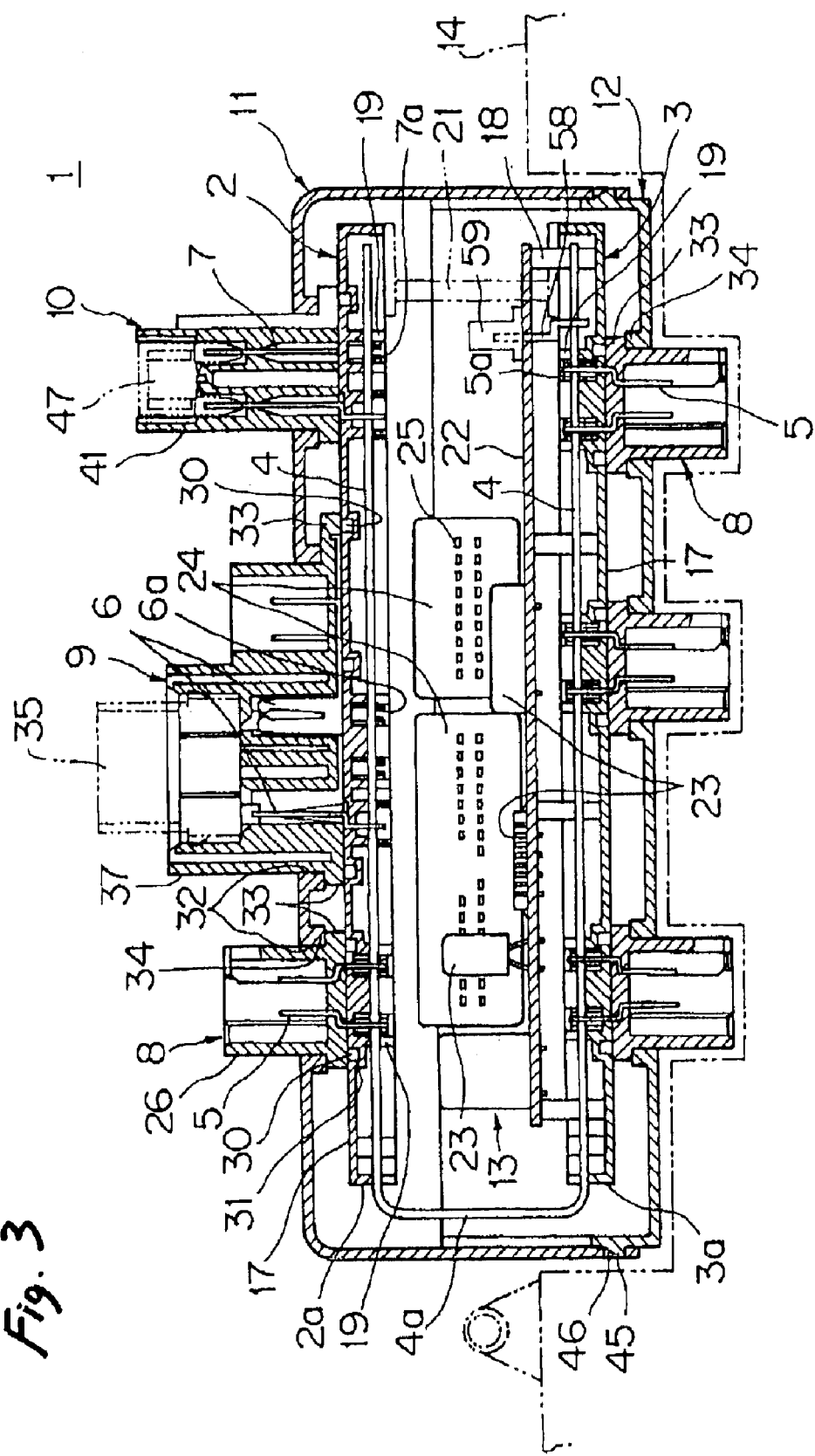
FIG. 3 is a longitudinal sectional view showing a second embodiment of the electrical junction box according to the invention.

FIG. 3 shows an electrical junction box 1 according to a second embodiment of the invention.

This electrical junction box 1 includes: two wiring boards 2, 3 made of insulating resin and arranged in parallel with each other; sheathed electric wires 4 (hereinafter referred to as electric wires) arranged on the wiring boards 2, 3; terminals 5 to 7 press-fitted to the electric wires 4; a plurality of connectors 8 and electric component mounting parts 9, 10 containing the terminals 5 to 7; an upper and lower casings 11, 12 made of synthetic resin from which the connectors 8 and the electric component mounting parts 9, 10 are projected outward; and an electronic unit 13 interposed between the two wiring boards 2, 3.

In FIG. 3, numeral 14 designates a setting table which is used on occasion of manufacturing the electrical junction box 1. The method of manufacturing the electrical junction box 1 will be described later in detail.

The electronic unit 13 is fixed to the lower wiring board 3. The lower wiring board 3 has a plurality of support posts 18 for securing the electronic unit which are provided on an upper face (an inner face) of a horizontal part 17. The upper and the lower wiring boards 2, 3 are positioned back to back in parallel, and the electric wires 4 are continuously arranged (wired) along respective inner faces of the wiring boards 2, 3. Specifically, the electric wires 4 are horizontally located above the lower wiring board 3, and the electric wires 4 are horizontally located below the upper wiring board 2, so that the upper and lower electric wires 4 are continued integrally at bent portions 4a extending in a vertical direction. A plurality of the electric wires 4 are arranged side by side in parallel. The wiring boards 2, 3 are provided with wire clamping parts 19 respectively in pairs at areas adjacent to the terminals 5 to 7, and the electric wires 4 are press-fitted to base end portions 5a to 7a of the terminals 5 to 7 while being guided by the wire clamping parts 19.

The electric wires 4 which are horizontally arranged along the lower wiring board 3 are projected a little horizontally outward from an end 3a of the lower wiring board 3, then, bent upwardly to extend vertically, and bent again at an end 2a of the upper wiring board 2 to be horizontally arranged along the upper wiring board 2. In this manner, a plurality of the electric wires 4 are bent at respective one ends of the two wiring boards 2, 3.

The upper and lower wiring boards 2, 3 are supported in parallel at an opposite side to the bent portions 4a of the electric wires 4 by a support post (spacer) 21, for example, which is shown by a phantom line. The support post 21 is located free from the electric wires 4. This support post 21 may be also provided at a side of the bent portions 4a of the electric wires 4. Alternatively, the upper wiring board 2 may be held on the upper face of the electronic unit 13. A supporting structure similar to the spacers 79 in the first embodiment may be also employed. A wiring board assembly is composed of at least the wiring boards 2, 3, the electric wires 4 and the support posts 21, or alternatively, of the wiring boards 2, 3, the electric wires 4, the support posts 21, and the terminals 5 to 7.

The electronic unit 13 includes a circuit board 22, electronic components 23 such as diodes, resistors, transistors, integrated circuits, etc. which are mounted on a surface of the circuit board 22, and connectors 24 for connecting their circuits to the exterior circuits. The electronic unit 13 can be applied, for example, for controlling an engine, an automatic transmission and so on in an automobile. The connectors 24, which have a plurality of pin-shaped terminals 25 contained in respective connector housings made of insulating resin, are positioned between the two wiring boards 2, 3 in such a manner that ends of the connectors 24 (end openings of connector fitting chambers) may be located at one side face of the electric junction box 1 (the junction box bodies 11, 12). It is possible to locate the ends of the connectors 24 on both side faces of the electric junction box 1. The power can be directly outputted from the electronic unit 13 by the connectors 24. The structure of these connectors 24 is substantially the same as the connectors 71 in the first embodiment. The circuit board 22 is electrically connected to the electric wires 4 on the lower wiring board 3 by way of terminals 58.

A press-fitting portions at one side (a lower side) of the terminals 58 are press-fitted to the electric wires 4 and tab-like contact portions at the other side (an upper side) of the terminals 58 protrude into a connector 59 on the circuit board 22 to be connected to mating terminals (not shown) of the circuit board 22 inside the connector 59. The mating terminals are electrically connected to the electronic components 23 and the connectors 24 on the circuit board by way of a printed circuit board or the like. The terminals 58 may be directly connected by soldering to the circuit on the circuit board 22 without employing the connector 59.

The connectors 8, the electric component mounting parts 9, 10 are provided on the outer faces of the upper and lower wiring boards 2, 3, in other words, the upper face of the upper wiring board 2 and the lower face of the lower wiring board 3.

Figure 4A:
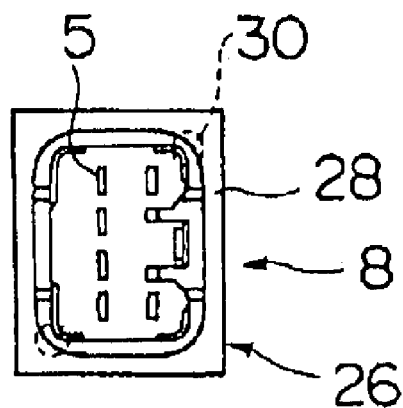
FIG. 4A and 4B are a plan view and a longitudinal sectional view respectively showing a connector of the electrical junction box of FIG. 3.
Figure 4B:
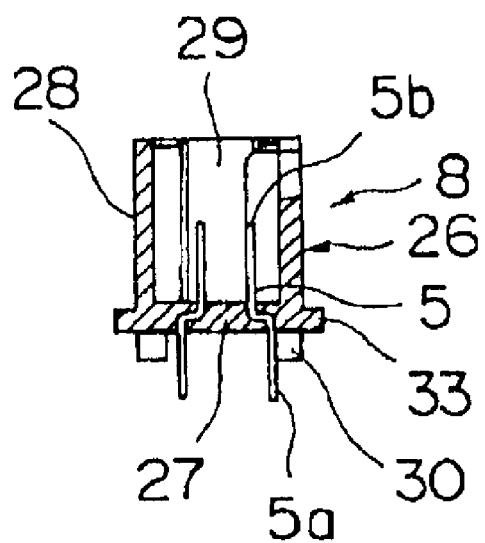

As shown in FIGS. 4A and 4B, each of the connectors 8 includes a connector housing 26 which has a horizontal bottom plate 27 and a surrounding wall 28 suspended from the bottom plate 27. The tab-like or pin-like terminals 5 whose middle parts are bent in a crank shape are rigidly fixed on the bottom plate 27 by insert molding or the like. Distal end portions 5b (contact portions) of the terminals 5 are projected into a connector fitting chamber 29 of the female connector housing 26, while base end portions (press-fitting portions) 5a of the terminals 5 are projected outward from the bottom plate 27 to pass through holes in the wiring board 2 (or 3) in FIG. 3.

The pressure contact portion 5a of each of the terminals 5 is composed of a pair of press-fitting pieces. The electric wire 4 in FIG. 3 is press-fitted between the pair of the press-fitting pieces, while tearing off the insulating sheath, and the conductive portion of the electric wire is connected to the respective press-fitting pieces. The terminals 5 are arranged side by side so as to form a plurality of rows (two rows in this embodiment). Positioning pins 30 in a short columnar shape are integrally formed on an outer face of the bottom plate 27 so as to protrude therefrom. The positioning pins 30 are provided in pair on right and left corners of the bottom plate in a diagonal relationship.

In correspondence with the positioning pins 30, there are provided holes 31 in each of the wiring boards in FIG. 3. The holes 31 are formed deeper than a base plate part 17 of the wiring board 2 (or 3), with their circumferences covered with resin, and the resin is continued to the aforesaid electric wire clamping portions 19. In a state where the positioning pins 30 are inserted and fitted into the holes 31 as shown in FIG. 3, the connectors 8 and the electric component mounting parts 9, 10 are pressed with the casings 11, 12 to be secured to the outer faces of the wiring boards 2, 3.

Each of the casings 11, 12 is provided with holes 32 for the connectors 8 and the electrical component mounting parts 9, 10 to pass through. There are integrally provided, at inner edges of the holes 32, projections 34 in a rectangular annular shape which are adapted to be abutted against the flange portions 33 in the bottom of the connectors 8 or the electrical component mounting parts 9, 10. Each of the casings 11, 12 has a rectangular box-like shape, and includes surrounding walls in all four directions and an upper or lower wall. The flange portion 33 of the connector 8 is formed by horizontally extending the bottom plate 27 (see FIG. 4B). The projections 34 press the flange portions 33 so as to press the connectors 8 and the electrical component mounting parts 9, 10 against the wiring boards 2, 3.

Figure 5A:
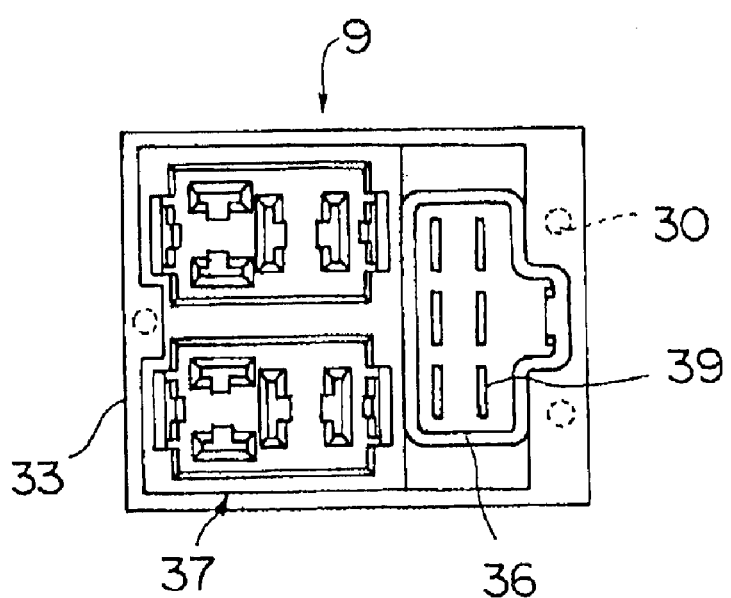
FIGS. 5A and 5B are a plan view and a longitudinal sectional view respectively showing a relay mounting part of the electrical junction box of FIG. 3.
Figure 5B:
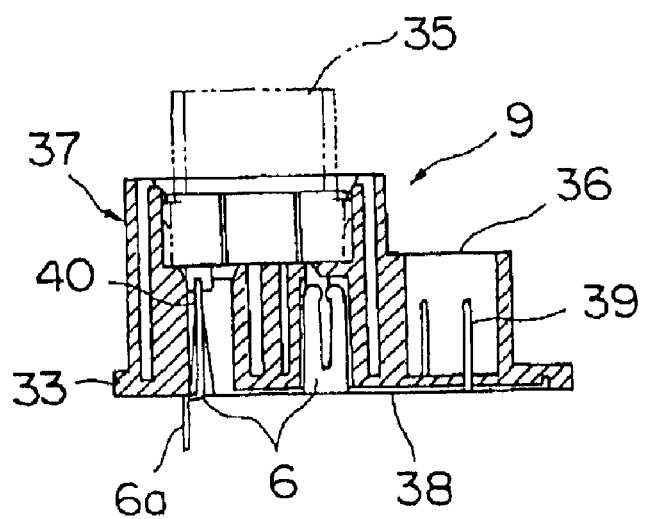

FIGS. 5A and 5B show the relay mounting part 9 as the electrical component mounting part.

In the relay mounting part 9, a plurality of (two) relays 35 can be provided in parallel, and additionally, a connector 36 for connection with an exterior wire harness (not shown) such as a power supply is integrally provided adjacent to the relays 35. Inside a housing 37 of the relay mounting part 9 which is made of insulating resin, there are arranged terminals 6 in a shape of a tuning fork for clamping and connecting the tab terminals of the relays 35. One (at a positive pole side of the power supply, for example) of the terminals 6 in the shape of a tuning fork is integrally continued to terminals 39 of the adjacent connector 36 by way of a bus-bar (a conductive metal plate), and the other terminals 6 in the shape of a tuning fork are press-fitted to the electric wires 4 on the wiring board 2 at their press-fitting portions 6a (see FIG. 3).

Each of the terminals 6 in the shape of a tuning fork is inserted into a narrow part 40 in the housing 37 to be positioned there. A base end portion of the terminal 6 in the shape of a tuning fork is bent in a crank shape to be abutted against the wiring board 2, and projects toward the electric wire 4 through the hole in the wiring board 2.

In the same manner as in the above described connector 8, the flange portions 33 are provided so as to protrude from the bottom end of the housing 37. The flange portions 33 are abutted against the wiring board 2 as shown in FIG. 3, and pressed with the casing 11 to be fixed, in a state positioned on the wiring board 2 by the positioning pins 30 at the bottom side.

Figure 6A:
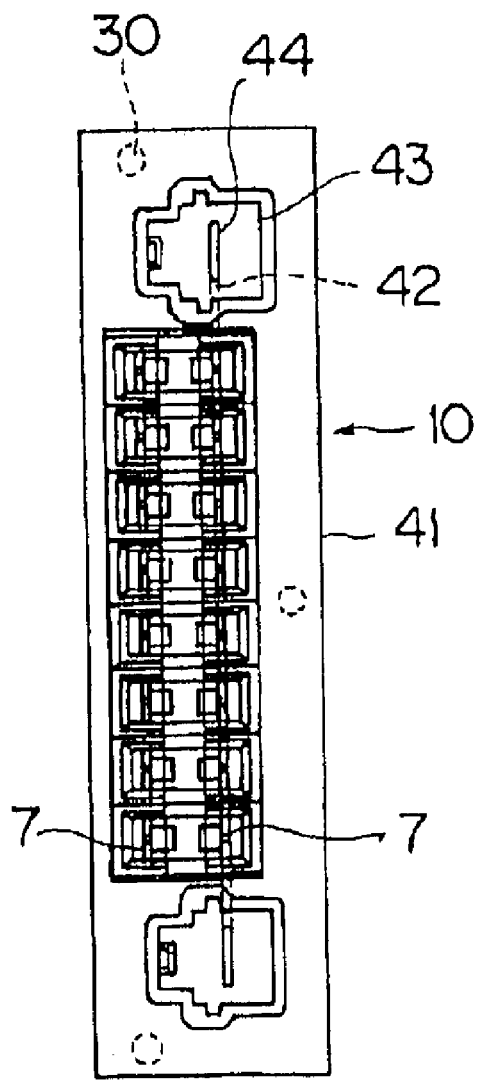
FIG. 6 are a plan view and a longitudinal sectional view respectively showing a fuse mounting part of the electrical junction box of FIG. 3.
Figure 6B:
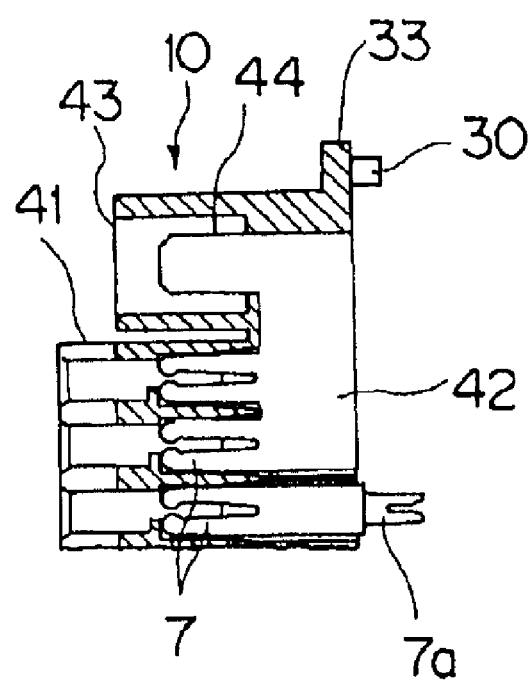

FIGS. 6A and 6B show the fuse mounting part 10 as the electrical component mounting part.

The fuse mounting part 10 is formed in a laterally elongated shape, in which a number of fuses can be arranged in parallel in a row. In a housing 41 of the fuse mounting part 10 which is made of insulating resin, there are arranged pairs of terminals 7 in a shape of a tuning fork. One group (at a grounding side) of the terminals 7 in the shape of a tuning fork are joined to one another by way of a bus-bar part 42 and integrally continued to tab terminals 44 inside connectors 43 which are integrally provided adjacent to the fuse mounting part 10. The other group of the terminals 7 in the shape of a tuning fork are press-fitted to the electric wires 4 at press-fitting portions 7a at their base ends (see FIG. 3). The fuse mounting part 10 integral with the connectors 43 is positioned on the wiring board 2 by the positioning pins 30 provided on the flange portions 33 at the bottom side, and secured by the flange portions 33 which are pressed with the casing 11. The upper and lower casings 11, 12 (FIG. 3) are locked to each other by locking members such as locking projections 45 and fitting holes 46.

According to the above described electrical junction box 1 of this embodiment, the relay mounting parts 9, and the fuse mounting parts 10 of various types are provided at both upper and lower sides thereof, although it contains the electronic unit 13 at a middle in a direction of thickness. Therefore, it is possible to connect or disconnect a number of exterior wire harnesses from both the upper and lower sides (both the front and back sides), and to connect or disconnect a number of the relays 35 and fuses 47 easily and effectively. Moreover, the electrical junction box 1 is finished in a compact size, although a number of the connectors 8, and a number of the relays 35 and the fuses 47 can be mounted on the electronic unit 13.

It is to be noted that the "upper and lower" directions of the electrical junction box 1 are not necessarily fixed, but sometimes, the "upper and lower" directions may be inverted or expressed by other terms "right and left" according to mode for use. The terms "upper and lower" directions are simply employed for convenience of explanation.

Figure 7:
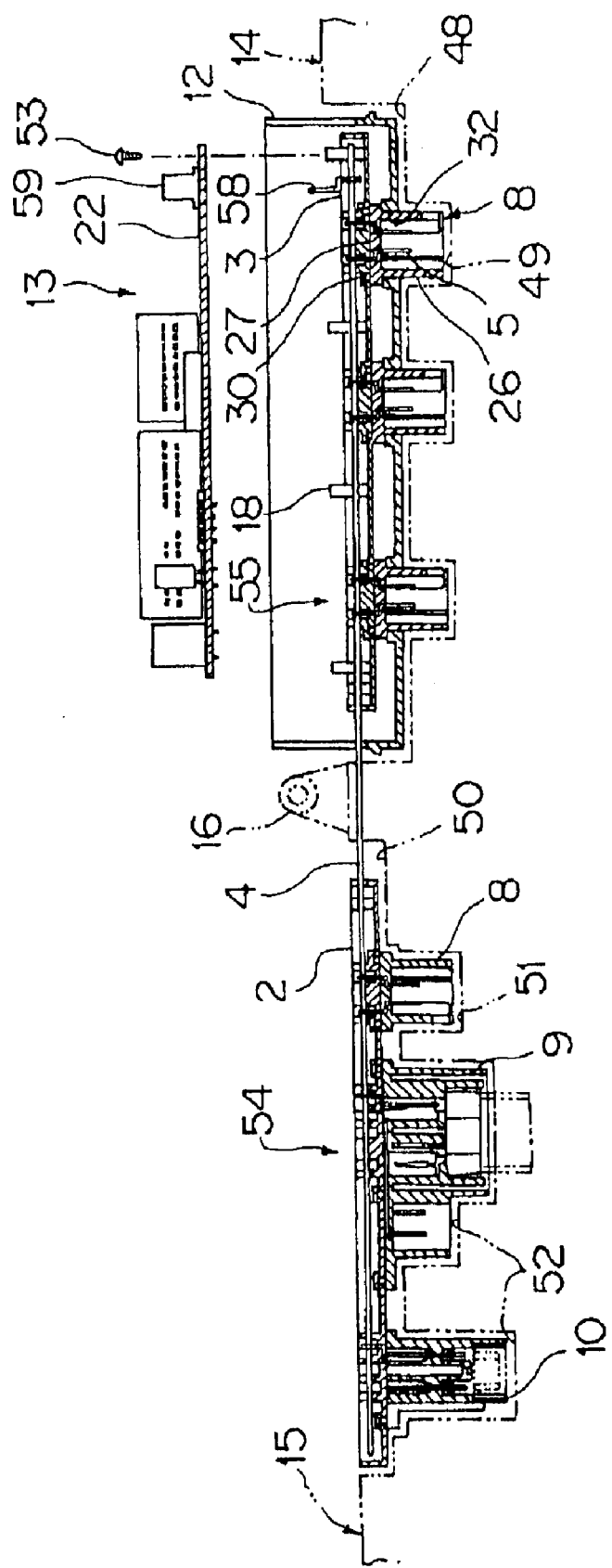
FIG. 7 is a longitudinal sectional view showing a first step in a method of manufacturing the electrical junction box of FIG. 3.
Figure 8:
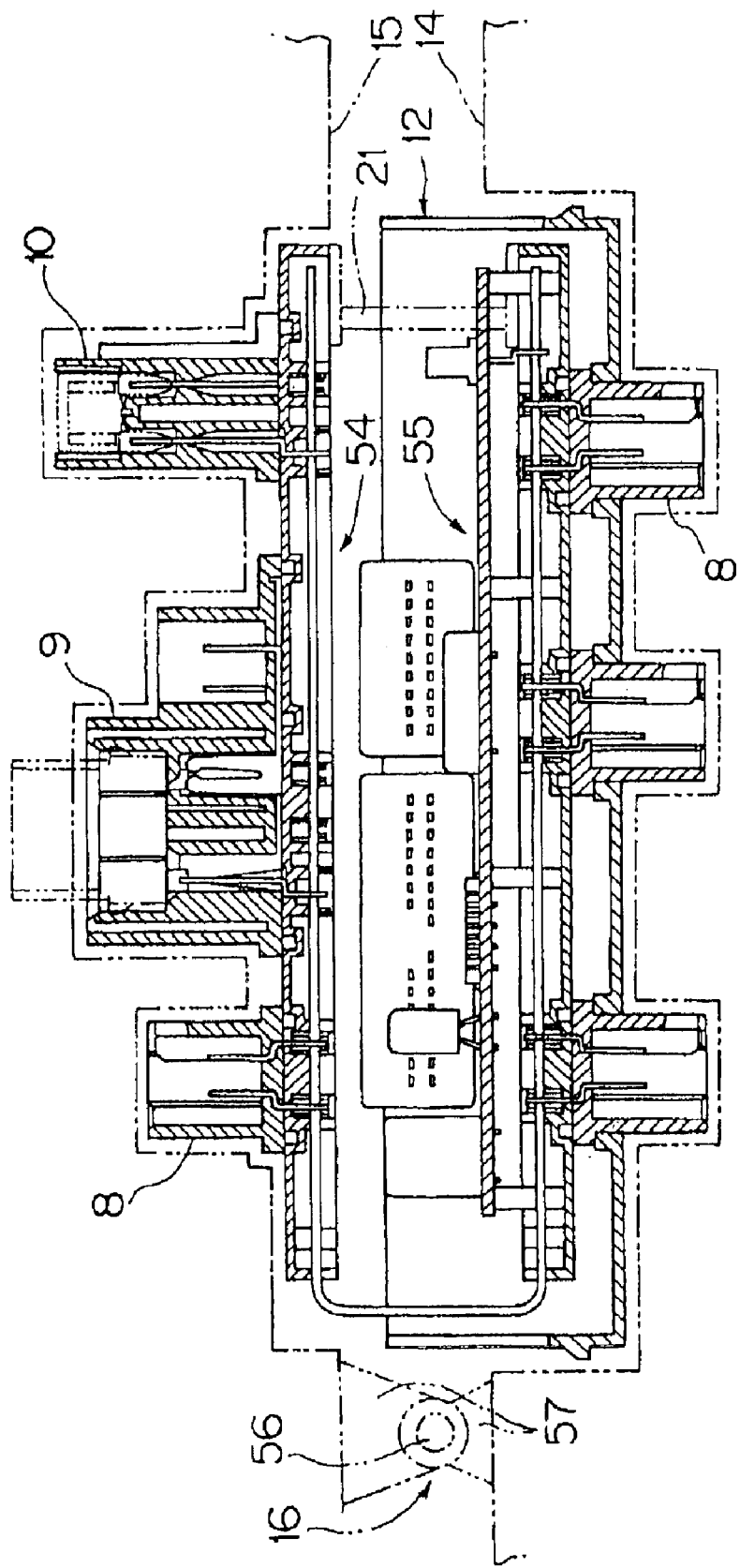
FIG. 8 is a longitudinal sectional view showing a second step in the method of manufacturing the electrical junction box of FIG. 3.
Figure 9:
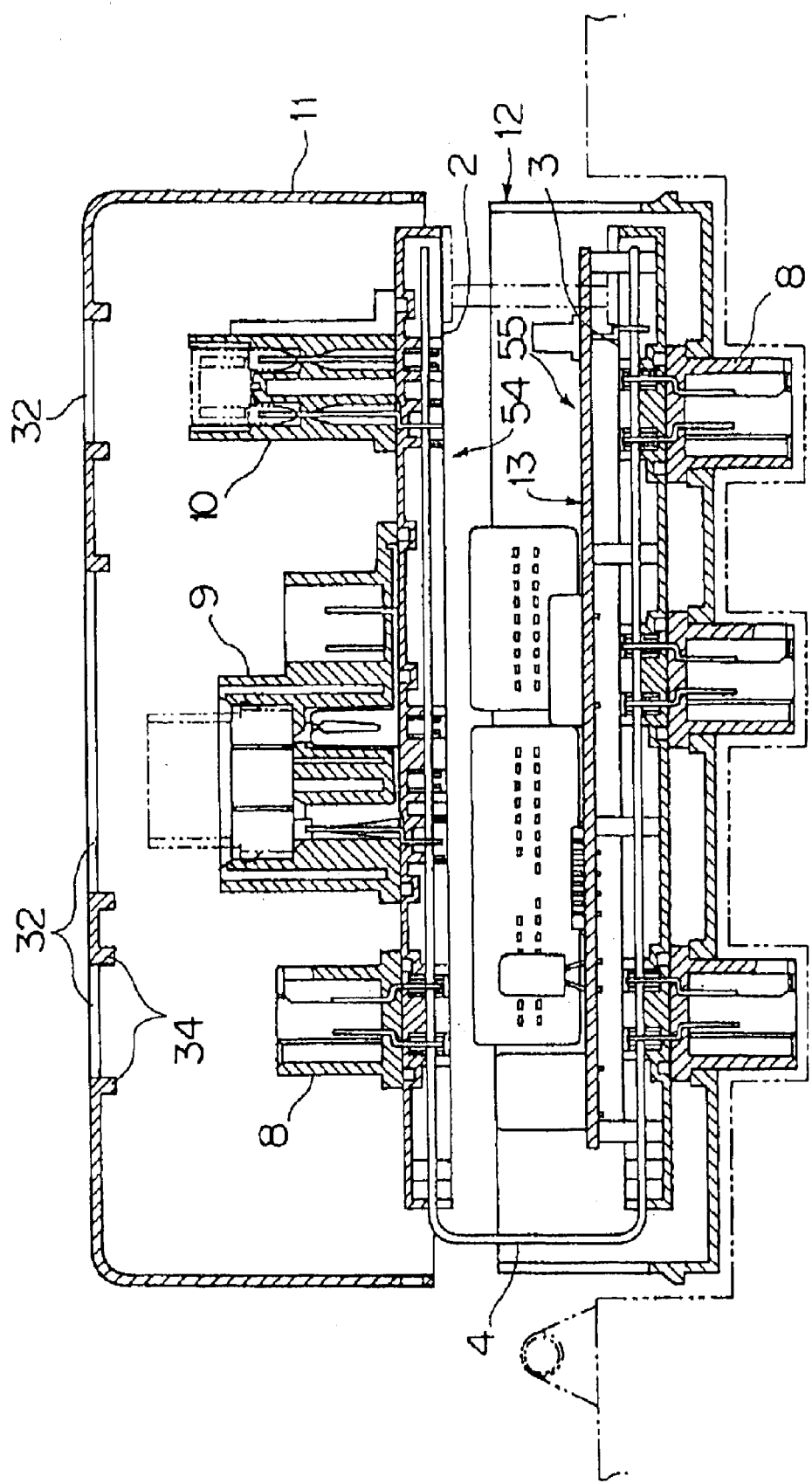
FIG. 9 is a longitudinal sectional view showing a third step in the method of manufacturing the electrical junction box of FIG. 3.
Figure 10:
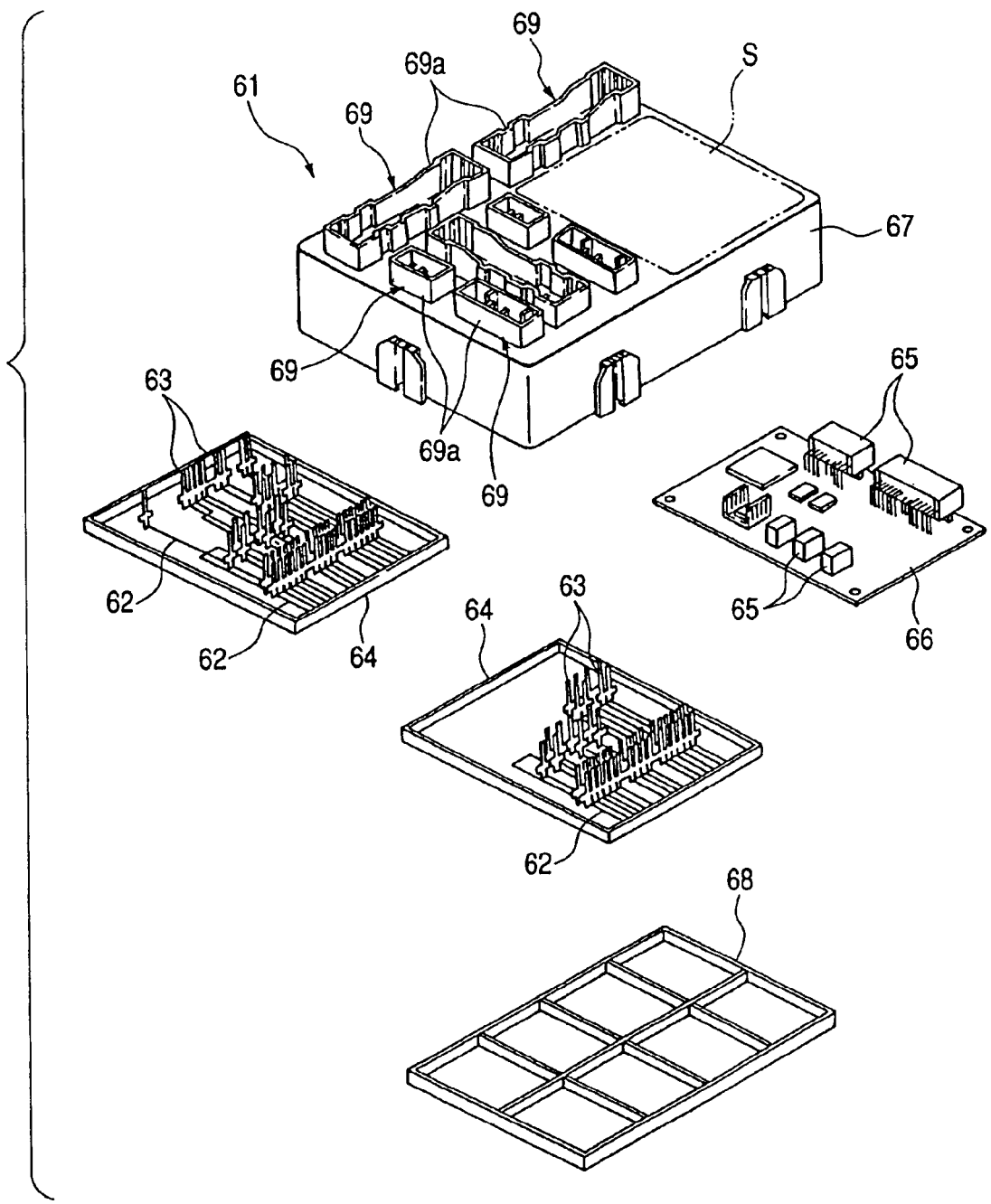
FIG. 10 is an exploded perspective view showing a related-art electrical junction box.

Referring now to FIGS. 7 to 9, the method of manufacturing the above described electrical junction box 1 will be described.

As a first step, a pair of setting tables 14, 15 which can be opened or closed around a hinge part 16 as a pivotal axis are prepared. On one (at a fixed side) of the setting tables 14, the casing 12, the connectors 8 and the wiring board 3 are set in this order and assembled, and at the same time, on the other setting table 15 (at a pivotable side), the connector 8, the electrical component mounting parts 9, 10, and the wiring board 2 are set and assembled.

The reason why the casing 11 (see FIG. 3) is not set on the other setting table 15 is, because the casings 11, 12 may interfere with each other when pivoting the setting table 15. In case where there is no such anxiety (in case where shapes of the casings 11, 12 are such that no interference may occur), the casing 11 can be also set on the other setting table 15.

The one setting table 14 is provided with a dented part 48 having a large volume (which is large both in area and depth) for setting the case, and in the dented part 48, there are formed small recesses 49 for setting the connectors. The other setting table 15 is provided with a dented part 50 having a large volume for setting the wiring board, and in the dented part 50, there are formed a recess 51 for setting the connector and the recesses 52 for setting the electrical component mounting parts. Sometimes, the recesses 52 for setting the electrical component mounting parts may be provided in one or both of the setting tables according to a type of the electrical junction box.

One of the casings (the lower one) 12 is first set on the one setting table 14, and the connectors 8 are then inserted into the holes 32 in the casing 12. The terminals 5 have been assembled to the connectors 8 in advance. The terminals 5 are secured to the bottom wall (bottom plate) 27 of the connector housing 26 by insert molding or by pressure inserting.

Thereafter, one of the wiring board 3 is set on the connectors 8 and pressed from the above, allowing the positioning pins 30 of the connectors 8 to be fitted with the holes 31 in the wiring board 3.

In tandem with these operations, the connector 8, the electrical component mounting parts 9, 10 are set on the other setting table 15, and the other (upper) wiring board 2 is positioned and secured above these members 8 to 9 by the positioning pins 30 and the holes 31 in the same manner.

In this state, the electric wires 4 are horizontally arranged and set from either one of the wiring boards 2 (or 3) to the other wiring board 3 (or 2). In this state, the electric wires 4 are pressed with a press-fitting blade (not shown) to be press-fitted to the press-fitting portions 5a to 7a of the terminals 5 to 7 in the connectors 8 and the electrical component mounting parts 9, 10 on the wiring boards 2, 3.

Then, the electronic unit 13 is set on the one wiring board 3, and the circuit board 22 of the electronic unit 13 is fastened and fixed to the support posts 18 of the wiring board 3 by small screws 53. At the same time when the electronic unit 13 is set, the terminals 58 on the wiring board 3 are inserted into the connector 59 on the electronic unit 13 to be connected to the mating terminals inside the connector 59. The terminals 58 are fixed to the wiring board 3. In case where the terminals 58 have been directly set on the circuit board 22 of the electronic unit 13, the press-fitting portions of the terminals 58 are press-fitted to the electric wires 4 at the same time when the electronic unit 13 is set.

Thereafter, the other setting table 15 is pivoted toward the one setting table 14 about the hinge 16 as the pivotal axis so that a divisional assembly 54 on the other setting table 15 may be positioned on a divisional assembly 55 on the one setting table 14 in parallel so as to be opposed to each other, as shown in FIG. 8. On this occasion, one or a plurality of the vertical support posts 21 may be preferably provided between the upper and lower wiring boards 2, 3 to maintain the two divisional assemblies 54, 55 in parallel. The divisional assembly 54 is composed of the connector 8, the electrical component mounting parts 9, 10, the wiring board 2, and the electric wires 4, while the divisional assembly 55 is composed of the casing 12, the connectors 8, the wiring board 3, and the electric wires 4.

The hinge 16 includes a horizontal shaft 56 at a center and a pair of brackets 57 which pivot about the shaft 56. At an opposite side to the hinge 16, the two setting tables 14, 15 may preferably be supported in parallel by a vertical stopper (not shown). The electric wires 4 are folded substantially in a U-shape or C-shape at the side of the hinge 16. The two divisional assemblies 54, 55 are connected to each other by the electric wires 4.

After the other setting table 15 is pivoted to return to a direction of opening, the other (upper) casing 11 is mounted so as to cover the upper divisional assembly 54, as shown in FIG. 9. The casing 11 is provided with the holes 32 for the connector 8 and the electrical component mounting parts 9, 10 to pass through.

By mounting the upper casing 11, the connector 8 and the electrical component mounting parts 9, 10 on the upper side are pressed and fixed to the wiring board 2 with the projections 34 at the hole edges of the casing 11, as shown in FIG. 3, thereby rendering the lower wiring board 3 to press the flange portions 33 of the connectors 8 against the projections 34 of the lower casing 12, by way of the support posts 21. The two casings 11, 12 are locked to each other by engagements between the projections 45 and the holes 46. Thus, the electrical junction box 1 will be completed.

In the above described manner, the electrical junction box 1 can be manufactured simply and efficiently.

In a developed state as shown in FIG. 7, a third setting table (not shown) may be provided adjacent to the setting table 15. A third wiring board (not shown) may be set on the third setting table, and a second electronic unit (not shown) may be set and secured below the third wiring board, while the electric wires 4 are set on the three wiring boards at a time. Then, by pivoting the third wiring board to be positioned on the second wiring board, and by pivoting, in this state, the second setting table 15 on the first setting table 14 as shown in FIG. 8, it is possible to position the third wiring board between the upper and lower wiring boards 2, 3.

The first wiring board 3 or the second wiring board 2 may include two divisional wiring boards. In this manner, the number of the wiring boards will be at least two.

Although the connectors 8 and the electrical component mounting parts 9, 10 are designed as separate members from the wiring boards 2, 3 in the above described embodiment, the respective housings 26, 37, 41 of the connectors 8 and the electrical component mounting parts 9, 10 may be integrally formed with the wiring boards 2, 3 by resin molding. In this case, the wiring boards provided with the housings are set on the setting tables at a time. The positioning parts 30, 31 will be unnecessary.

The terminals 5 may be contained in female or male housings which are integrally formed on the casings 11, 12 made of synthetic resin, without employing the above described separate connectors 8. In this case, the wiring boards 2, 3 are pressed and secured by the projections 34 of the casings. Also in this case, the connector is composed of the housing and the terminals. The housing is provided with the positioning pins 30 corresponding to the holes 31 in the wiring boards 2, 3.

In FIG. 7, the casing 12 may be assembled to the divisional assembly 55 after pivoting the setting table 15 in the same manner as the casing 11. However, in this case, assembling efficiency will be lowered somehow.

Other than the fuses and relays, fusible links or other electrical components may be connected to at least one of the front and back faces of the electrical junction box.

What is claimed is:

1. An electrical junction box, comprising:
   a first board part and a second board part, arranged substantially in parallel while opposing to each other;
   an electric wire, extending along both of the first board part and the second board part, and having a bent portion extending across a gap defined between the first board part and the second board part; and
   an electronic unit disposed in the gap, said electric unit having a circuit board and at least one electronic component connected thereto.

2. The electrical junction box as set forth in claim 1, wherein the first board part and the second board part are integrated by a flexible part along which the bent portion of the electric wire is arranged.

3. The electrical junction box as set forth in claim 1, further comprising:
   a terminal, disposed on each outer face of the first board part and the second board part so as to electrically connect to the electric wire; and
   a housing, containing the terminal therein.

4. The electrical junction box as set forth in claim 1, wherein the electronic unit is electrically connected and fixed to at least one of the first board part and the second board part.

5. The electrical junction box as set forth in claim 1, further comprising a spacer disposed at least one of between the first board portion and the second board portion, between the electronic unit and the first board portion, and between the electronic unit and the second board portion.

6. The electrical junction box as set forth in claim 3, further comprising a casing, which contains therein at least the first board portion, the second board portion, the electronic unit and the electric wire.

7. The electrical junction box as set forth in claim 3, wherein the electronic unit comprises a connector terminal which is directed parallel with an extending direction of the first board part and the second board part.

8. The electrical junction box as set forth in claim 6, wherein:
the casing is formed with a hole through which the housing is protruded outward; and
the housing is formed with a flange portion which is pressed by the outer face of each of the first board portion and the second board portion, so that the flange portion is abutted against an inner face of the casing at an edge portion of the hole.

9. The electrical junction box as set forth in claim 3, further comprising a positioning member which determines a position of the housing with respect to associated one of the first board portion and the second board portion.

10. The electrical junction box as set forth in claim 6, wherein the housing is integrally formed with either the casing or at least one of the first board portion and the second board portion.

* * * * *